US008828139B2

(12) United States Patent
Imai et al.

(10) Patent No.: US 8,828,139 B2
(45) Date of Patent: Sep. 9, 2014

(54) METHOD OF MANUFACTURING SAPPHIRE SEED AND METHOD OF MANUFACTURING SAPPHIRE SINGLE CRYSTAL

(75) Inventors: Masato Imai, Tokyo (JP); Kouzou Nakamura, Tokyo (JP)

(73) Assignee: Sumco Corporation, Tokyo (JP)

( * ) Notice: Subject to any disclaimer, the term of this patent is extended or adjusted under 35 U.S.C. 154(b) by 559 days.

(21) Appl. No.: 13/161,170

(22) Filed: Jun. 15, 2011

(65) Prior Publication Data

US 2011/0308447 A1 Dec. 22, 2011

(30) Foreign Application Priority Data

Jun. 17, 2010 (JP) ................. 2010-137987
Jun. 17, 2010 (JP) ................. 2010-138017
May 27, 2011 (JP) ................. 2011-118748

(51) Int. Cl.
*C30B 15/36* (2006.01)
*C30B 15/00* (2006.01)

(52) U.S. Cl.
CPC ............. *C30B 15/00* (2013.01); *C30B 15/36* (2013.01)
USPC ................. 117/35; 117/11; 117/13

(58) Field of Classification Search
CPC ............... C30B 15/00; C30B 15/36
USPC ........... 117/11, 13, 35, 911, 937, 950
See application file for complete search history.

(56) References Cited

U.S. PATENT DOCUMENTS 5,968,260 A * 10/1999 Saishouji et al. ............ 117/13
2008/0075941 A1   3/2008 Tatartchenko et al.
2009/0081456 A1 *  3/2009 Goyal ...................... 428/389

FOREIGN PATENT DOCUMENTS

JP         2008-260641        10/2008

OTHER PUBLICATIONS

A. Nakamura, "Control of Dislocation Configuration in Sapphire", Act Materialia 53 (2005), pp. 455-462.
Korean Office Action issued Dec. 26, 2012 for Application No. 10-2011-0058389 (5 Pages).
Office Action in Taiwan App. No. 100120719 dated Dec. 26, 2013 (5 pages).

* cited by examiner

*Primary Examiner* — Michael Kornakov
*Assistant Examiner* — Kenneth A Bratland, Jr.
(74) *Attorney, Agent, or Firm* — Thomas J. Engellenner; Reza Mollaaghababa; Pepper Hamilton LLP

(57) ABSTRACT

Methods of manufacturing a sapphire seed for growing a crystal having reduced dislocation density. The present invention provides a method of manufacturing a sapphire seed formed by a sapphire single crystal and used for growing another sapphire single crystal on a (0001) face as a crystal growing surface, the method comprising: preparing a sapphire seed whose side face forms a crystal face within a {1-100} face±10 °, and whose shape is processed so as to include a hexagonal prism or a triangle prism; and applying a predetermined thermal treatment to said sapphire seed.

8 Claims, 3 Drawing Sheets

METHOD OF MANUFACTURING SAPPHIRE SEED AND METHOD OF MANUFACTURING SAPPHIRE SINGLE CRYSTAL

This application is based on and claims the benefit of priority from Japanese Patent Applications No. 2010-437987 filed Jun. 17, 2010, No. 2010138017 filed Jun. 17, 2010 and No. 2011-118748 filed May 27, 2011, the contents of which are incorporated by reference in their entirety.

TECHNICAL FIELD

The present invention relates to a sapphire seed and a method of manufacturing the sapphire seed. In particular, the present invention relates to a sapphire seed for growing a high-quality sapphire single crystal and a method of manufacturing the sapphire seed.

Further, the present invention also relates to a method of manufacturing a sapphire single crystal. In particular, the present invention relates to a method of manufacturing a high-quality sapphire single crystal.

RELATED ART

A sapphire single crystal is a single crystal of aluminum oxide having a crystal structure of rhombohedral system or a crystal structure approximated by a hexagonal system. The sapphire single crystals are widely used as an industrial material because of its excellent mechanical characteristics, chemical stability, and optical properties, and in particular, are used for a GaN film-forming substrate for manufacturing a blue/white light emitting diode (LED).

There are various methods for growing such a sapphire single crystal, but the sapphire single crystal is generally grown through a method using a single crystal growing technique called a Czochralski method (CZ method) because a large crystal can be relatively easily grown through the CZ method, and the like.

In this CZ method, high quality single crystal ingots can be produced generally through the following processes. First, a seeding process is performed by bringing a seed crystal (seed) formed of a single crystal into contact with a polycrystalline raw material melted in a crucible. Then, the seed is rotated and gradually pulled up while controlling a pulling-up rate and a temperature of the melt.

However, if a dislocation exists in the seed, the dislocation in the seed is transferred to the single crystal grown thereafter, which deteriorates the quality of the single crystal ingot. The dislocation exists in the seed in the case where the dislocation has already existed in the produced seed, or the dislocation occurs at a crystal growing surface of the seed due to the thermal shock at the time of seeding, for example. In view of the facts described above, for example, in the case of producing a silicon single crystal ingot, a process called a necking in which the diameter thereof is reduced once is generally implemented after seeding and before the diameter of the ingot increases, to prevent the dislocation from being transferred to the single crystal grown thereafter.

However, the growth rate of the sapphire single crystal is slower than that of the silicon single crystal in the order to double digit. Therefore, the time required for the necking reaches tens of hours or more. Further, the melting point of the sapphire crystal is 2050° C., and is higher than that of the silicon crystal whose melting point is 1412° C. Therefore, convection of the melt is likely to change due to the effect of change of compositions at the surface of the melt or change in temperature distribution in the furnace, which makes it difficult to stabilize the temperature of the melt in the vicinity of the seed for a long period of time. For the reasons described above, in the case where the sapphire single crystal is grown through the CZ method, the necking process is not generally performed.

Therefore, there has been a demand for a technique that can obtain the sapphire single crystal ingot having higher quality using a sapphire seed having further reduced dislocation density.

Patent Document 1 discloses a technique for manufacturing a high quality single crystal, in which a temperature of a raw material melt is adjusted in the appropriate range relative to the melting point of a raw material for single crystal to prevent the surface of a seed crystal from melting, and reduce the dislocation occurring at the boundary between the seed crystal and the melt. However, Patent Document 1 does not give any consideration to dislocation contained in the seed crystal itself before being brought into contact with the melt.

Further, Non-Patent Document 1 discloses a technique for reducing the dislocation density by applying a predetermined thermal treatment to a thin film having a high dislocation density and having a surface formed by a specific crystal surface. However, said technique relates to a relationship between the surface and the thermal treatment, and does not take the thickness thereof into consideration. Therefore, it does not give any consideration for reducing the dislocation density of the single crystal sapphire seed such as a seed having a certain thickness.

RELATED ART DOCUMENTS

Patent Document

Patent Document 1: Japanese Patent Application Laid-open. No, 2008-260641

Non-Patent Document

Non-Patent Document 1: Atsutomo Nakamura, et al. "Control of dislocation configuration in sapphire" Acta Materialia, Jan. 10, 2005, Vol. 53[2] pp. 455-462

PROBLEMS TO BE SOLVED BY THE INVENTION

An object of the present invention is to solve the problems described above, and to provide a sapphire seed having reduced dislocation density and used for growing a crystal and a method of manufacturing the sapphire seed.

Further, another object of the present invention is to solve the problems described above, and to provide a method of manufacturing a sapphire single crystal capable of growing a high quality sapphire single crystal.

SUMMARY OF THE INVENTION

The present inventors made a keen study on solving the problems described above, and found that it is possible to reduce the dislocation density parallel to the c axis by applying a predetermined thermal treatment to a sapphire seed formed by a sapphire single crystal and used for growing another sapphire single crystal on a (0001) face as a crystal growing surface.

Further, it is also found that it is possible to reduce the dislocation density at the crystal growing surface of the sapphire seed by forming the shape of the sapphire seed for growing the crystal so as to include a hexagonal prism or a triangle prism, and disposing the side face thereof in the plus/minus predetermined range with respect to a {1-100} face. Then, the present inventor reached the present invention.

The present invention has been made on the basis of the findings described above, and main points and configurations thereof are as follows:

(1) A method of manufacturing a sapphire seed formed by a sapphire single crystal and used for growing another sapphire single crystal on a (0001) face as a crystal growing surface, the method comprising:

preparing a sapphire seed whose side face forms a crystal face within a {1-100} face±10°, and whose shape is processed so as to include a hexagonal prism or a triangle prism; and applying a predetermined thermal treatment to said sapphire seed.

(2) The method of manufacturing a sapphire seed according to (1) above, wherein the thermal treatment includes a first thermal treatment in the range of 1400 to 1800° C.

(3) The method of manufacturing a sapphire seed according to (2) above, wherein the thermal treatment includes a two-step thermal treatment formed by the first thermal treatment and a second thermal treatment in the range of 1000 to 1200° C.

(4) The method of manufacturing a sapphire seed according to (3) above, wherein, in the thermal treatment, the two-step thermal treatment is repeated plural times.

(5) The method of manufacturing a sapphire seed according to (2), (3) or (4) above, wherein, in the thermal treatment, the first thermal treatment is applied for 30 minutes or more.

(6) The method of manufacturing a sapphire seed according to (3) or (4) above, wherein, in the thermal treatment, the second thermal treatment is applied for 10 minutes or more.

(7) A method of manufacturing a sapphire single crystal, comprising:

a step of applying a predetermined thermal treatment to a sapphire seed formed by a sapphire single crystal and having a side face that forms a crystal face within a {1-100} face±10°, the sapphire seed being shaped so as to include a hexagonal prism or a triangle prism, a step of introducing a raw material for growing a sapphire single crystal into a crucible, heating the introduced raw material to melt, thereby forming a raw material melt;

a step of bringing the sapphire seed that has been applied to the thermal treatment into contact with the raw material melt; and a step of growing a sapphire single crystal on a (0001) face of the sapphire seed while pulling up the sapphire seed.

(8) The method of manufacturing a sapphire single crystal according to (7) above, wherein the thermal treatment is applied in a manner that the sapphire seed is disposed above the raw material melt.

(9) The method of manufacturing a sapphire single crystal according to (8) above, wherein the thermal treatment includes a first thermal treatment applied at a first position above the raw material melt in a manner that a temperature of a top end of the sapphire seed is in the range of 1400 to 1800° C.

(10) The method of manufacturing a sapphire single crystal according to (9) above, wherein the thermal treatment includes a two-step thermal treatment formed by the first thermal treatment, and a second thermal treatment applied at a second position above the raw material melt in a manner that a temperature of the top end of the sapphire seed is in the range of 1000 to 1200° C.

(11) The method of manufacturing a sapphire single crystal according to (10) above, wherein, in the thermal treatment, the two-step thermal treatment is repeated plural times.

(12) The method of manufacturing a sapphire single crystal according to (9), (10) or (11) above, wherein, in the thermal treatment, the first thermal treatment is applied for 30 minutes or more.

(13) The method of manufacturing a sapphire single crystal according to (10) or (11) above, wherein, in the thermal treatment, the second thermal treatment is applied for 10 minutes or more.

EFFECT OF THE INVENTION

According to the present invention, a predetermined thermal treatment is applied to a sapphire seed for growing a crystal on a (0001) face as a crystal growing surface, the side face of which sapphire seed forms a crystal face positioned within a (1-100) face±predetermined range, and the sapphire seed being shaped so as to include a hexagonal prism or a triangle prism. With this configuration, it is possible to obtain a sapphire seed whose dislocation density is reduced to a predetermined value or lower at the crystal growing surface. Further, by using said sapphire seed, it is possible to grow, on the (0001) face, a high quality sapphire single crystal having reduced dislocation density or free from dislocation.

DETAILED DESCRIPTION

[Method of Manufacturing a Sapphire Seed]

An embodiment of a method of manufacturing a sapphire seed according to the present invention will be described with reference to the drawings.

The method of manufacturing the sapphire seed according to the present invention is a method of manufacturing a sapphire seed formed by a sapphire single crystal and used for growing another sapphire single crystal (ingot) on a (0001) face as a crystal growing surface, and the method comprises a step of preparing a sapphire seed whose side face forms a crystal face positioned within a {1-100} face±10°, and whose shape is processed so as to include a hexagonal prism or a triangle prism, and a step of applying a predetermined thermal treatment to the sapphire seed. With the above-described steps, it is possible to manufacture a sapphire seed having reduced dislocation density at a crystal growing surface.

Figure 1:
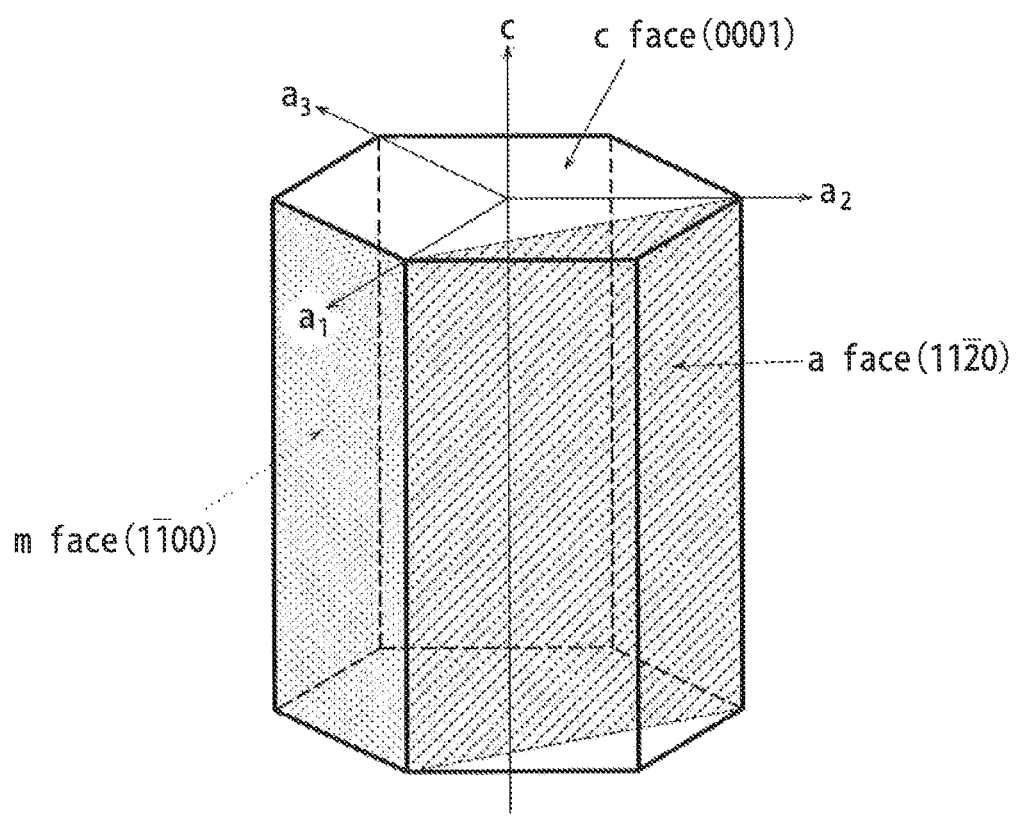
FIG. 1 is a schematic view illustrating a unit cell of a sapphire single crystal in which a rhombohedral system is approximated by a hexagonal system.

FIG. 1 illustrates a unit cell of the sapphire single crystal. The sapphire single crystal has a crystal structure of a rhombohedral system in a precise sense, but may be approximated by the hexagonal system as illustrated in FIG. 1. The "sapphire seed" manufactured through the present invention is formed by a sapphire single crystal. In general, at the time of cutting out wafers for forming GaN layer etc. from a sapphire single crystal ingot, the wafers are cut out in a manner that a principal plane of the wafer is a (0001) face (c face) of the sapphire single crystal.

In order to reduce the wasted material as much as possible, it is desirable to obtain an ingot having a substantially cylindrical shape by growing the crystal in the c axis direction, and cut the ingot in a perpendicular direction to the c axis direction (longitudinal direction of the ingot). Therefore, the crystal growing surface of the sapphire seed is set to be a (0001) face. Note that setting the crystal growing surface to be a (0001) face has the same meaning as setting the direction of crystal growth axis to be [0001]. More specifically, the axis orientation of the seed crystal is [0001]. If the axis orientation of the seed crystal is perpendicular to the (0001) face, the axis orientation of the crystal connecting with the seed as the single crystal is [0001] regardless of the shape of the top end of the seed, and the crystal grows at the (0001) face from the macroscopic viewpoint.

Figure 2:
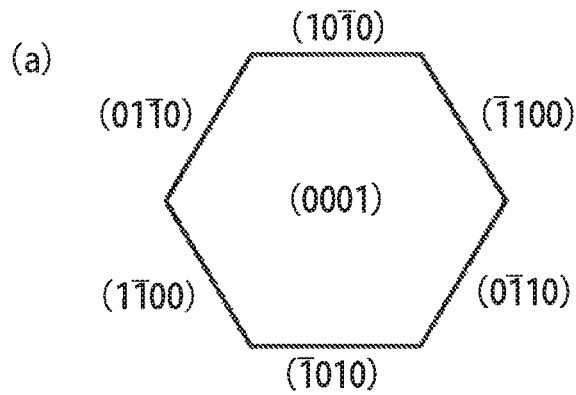
FIG. 2(*a*) is a schematic sectional view of a hexagonal-prism sapphire seed according to the present invention, and FIG. 2(*b*) is a schematic sectional view of a triangle-prism sapphire seed according to the present invention.

FIG. 2(a) and FIG. 2(b) are schematic sectional views illustrating sapphire seeds in the case where the shapes of the sapphire seeds are a hexagonal prism and a triangle prism, respectively. As illustrated in FIGS. 2(a) and 2(b), the sapphire seed is processed such that all of the six or three side faces of the sapphire seed form crystal faces positioned within a {1-100} face±10° (in FIG. 2, the side face of the sapphire seed and the {1-100} face are the same), and the side face of the sapphire seed is processed so as to have the hexagonal prism shape or the triangle prism shape. This process is performed by measuring the orientation with the X-ray diffraction analysis and using, for example, a diamond blade.

Figure 3:
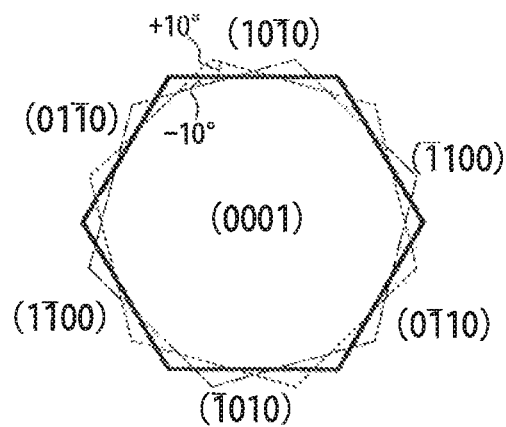
FIG. 3 is a schematic sectional view illustrating a side face of the sapphire seed according to the present invention that is rotated around the c axis. The solid line represents a case where the side face is a {1-100}, whereas the broken line represents a case where the side face is inclined by 10° from the {1-100}

It should be noted that the side faces of the sapphire seed being within a {1-100} face±10° means that, as illustrated in the broken line and the alternate long and short dashed line in FIG. 3, each of the side faces of the sapphire seed includes a crystal face obtained by rotating it around the c axis by ±10° or lower from the solid line representing the {1-100} face.

In the present invention, the sapphire seed processed as described above is prepared, and a predetermined thermal treatment is applied to the sapphire seed. The thermal process may be performed in the atmosphere of air, oxygen ($O_2$), argon (Ar), helium (He), nitrogen ($N_2$) and the like.

The present invention is not made only on the basis of theories. However, it is considered that the present invention can reduce the dislocation density by the operations described below. The dislocation in the sapphire seed is the most stable in the <1-100> direction of the (0001) face. Further, in the vicinity of the surface of the seed, the large image force acts on the dislocation, and thus, the dislocation receives a large force that causes the surface of the seed to be in the vertical position. As described above, the side faces of the sapphire seed form the crystal faces positioned within a {1-100} face±10° around the c axis, whereby it is possible to match the direction that makes the dislocation stable with the direction in which the image force acts. Further, it is known that, if the sapphire single crystal is maintained at a high temperature, the point defects gather due to the strain field around the dislocation and move upward, which changes the shape of the dislocation. Yet further, it is also known that the dislocation performs sliding motion due to the thermal stress resulting from the temperature gradient. Therefore, by applying the thermal treatment to the sapphire seed, the dislocation exposed at the surface of the seed is made in the vertical position with respect to the surface of the seed due to the image force, upward movement and sliding motion. Since forces that shorten its length act on the dislocation, the vertical component thereof in the vicinity of the surface of the seed becomes gradually longer at a temperature at which the dislocation can move. It is considered that, as a result, it is possible to reduce the density of the dislocation parallel to the axis.

The thermal treatment preferably includes a first thermal treatment in the temperature range of 1400 to 1800° C. (high temperature thermal treatment). In the case where the first thermal treatment is less than 1400° C., the upward movement of the dislocation does not sufficiently occur, and hence, there is a possibility that the change of shape of the dislocation is insufficient. On the other hand, in the case where the first thermal treatment exceeds 1800° C., the dislocation increases due to the sliding motion of the dislocation, possibly increasing the dislocation density.

It is preferable that the thermal treatment includes a two-step thermal treatment formed by the first thermal treatment, and a second thermal treatment applied in the range of 1000 to 1200° C. after the first thermal treatment (low temperature thermal treatment). This is because the high temperature thermal treatment generates the large amount of point defects; the low temperature thermal treatment applied thereafter supersaturates the point defects; and, the supersaturated point defects move the dislocation. In the case where the second thermal treatment is less than 1000° C., there is a possibility that diffusion of the point defects becomes undesirably slower. On the other hand, in the case where the second thermal treatment exceeds 1200° C., there is a possibility that the degree of supersaturation of the point defects is small. Therefore, it is preferable to set the range from 1000° C. to 1200° C.

It is preferable that the two-step thermal treatment formed by the high temperature treatment and the low temperature thermal treatment thereafter is implemented plural times. This is because, by implementing the two-step thermal treatment plural times, it is possible to obtain the effect of increasing the degree of supersaturation of the point defects to facilitate the upward movement of the dislocation.

It is preferable that, in the thermal treatment, the first thermal treatment is performed for 30 minutes or longer for the purpose of lengthening the portion of the dislocation oriented perpendicular to the surface of the seed due to the upward movement of the dislocation or sliding movement. This treatment duration can be shortened by raising the temperature at the time of the thermal treatment.

In the thermal treatment, it is preferable that the second thermal treatment is performed for 10 minutes or longer for the purpose of sufficiently decreasing the temperature of the seed to the predetermined temperature. This treatment duration can be shortened by raising the temperature of the thermal treatment.

[Sapphire Seed]

An embodiment of a sapphire seed according to the present invention will be described.

The sapphire seed according to the present invention is formed by a sapphire single crystal, and is used for growing another sapphire single crystal (ingot) on a (0001) face as a crystal growing surface. The sapphire seed is characterized in that: a side face of the sapphire seed forms a crystal face positioned within a {1-100} face±10°; a shape of the sapphire seed includes a hexagonal prism or a triangle prism; and a dislocation density of the crystal growing surface is $10^3/cm^2$ or lower. With this configuration, it is possible to grow a high quality sapphire single crystal having reduced dislocation density or free from dislocation on the crystal growing surface of the sapphire seed.

The sapphire seed described above can be obtained through the manufacturing method as described above.

It is preferable that a size of the crystal growing surface of the sapphire seed is in the range of 5 to 12 mm. In this specification, the wording "size of the crystal growing surface" refers to a diameter of a circle that circumscribes a hexagon in the case where the shape of the sapphire seed is the hexagonal prism, and refers to a diameter of a circle that circumscribes a triangle in the case of the triangle prism. In the case where the size of the crystal growing surface is less than 5 mm, there is a possibility that the seed melts in the seeding process due to the slight temperature variation of the melt. On the other hand, in the case where the size of the crystal growing surface exceeds 12 mm, the number of dislocations perpendicularly existing at the top end of the seed increases, and hence, there is a possibility that dislocations cannot be reduced.

[Method of Manufacturing a Sapphire Single Crystal]

An embodiment of a method of manufacturing a sapphire single crystal according to the present invention will be described with reference to the drawings.

Figure 4:
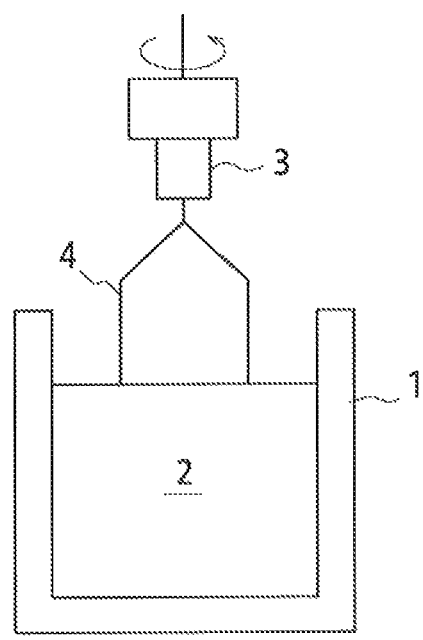
FIG. 4 is a schematic sectional view illustrating a part of steps of manufacturing the sapphire single crystal.

As illustrated in FIG. 4, the method of manufacturing the sapphire single crystal according to the present invention comprises: a step of introducing a raw material for growing the sapphire single crystal into a crucible 1, heating the introduced raw material and melting it, thereby forming a raw material melt 2; a step of bringing a sapphire seed 3 into contact with the raw material melt 2; and a step of growing a sapphire single crystal 4 on a crystal growing surface of the sapphire seed while pulling up the sapphire seed 3. The sapphire seed 3 used in the present invention is formed by a sapphire single crystal, whose side face forms a crystal face positioned within a {1-100} face±10° and whose shape is processed so as to include a hexagonal prism or a triangle prism. Further, a predetermined thermal treatment is applied to the sapphire seed 3. Hereinafter, the application of the thermal treatment to the sapphire seed is referred to as "seed heating process," The (0001) face of the sapphire seed 3 that has been subjected to the thermal treatment is brought into contact with the raw material melt 2. In the present invention, with said process, it is possible to grow a high quality sapphire single crystal having reduced dislocation or free from dislocation on the (0001) face of the sapphire seed.

It is preferable that the seed heating process is performed by disposing the sapphire seed above the raw material melt 2. This makes it possible to heat the sapphire seed at an appropriate temperature by making the most of the heat from the raw material melt, and to grow the sapphire single crystal in the sequential manner thereafter, which facilitates the process.

A preferred mode of the thermal treatment applied to the sapphire seed will be described below. The seed heating process preferably includes applying a first thermal treatment at a first position above the raw material melt, in which the temperature at the top end of the sapphire seed is in the range of 1400 to 1800° C. Further, the seed heating process preferably includes a two-step thermal treatment formed by the first thermal treatment, and a second thermal treatment applied at a second position above the raw material melt after the first thermal treatment, in which the temperature at the top end of the sapphire seed is in the range of 1000 to 1200° C. Note that the term "top end of the sapphire seed" as used in this specification means an end portion of the sapphire seed located nearest to the raw material melt. Further, it is preferable that, in the seed heating process, the two-step thermal treatment is implemented plural times. At this time, the two-step thermal treatment is implemented in a manner that the sapphire seed 3 is vertically moved above the raw material melt Further, it is preferable that, in the seed heating process, the first thermal treatment is applied for 30 minutes or more, and the second thermal treatment is applied for 10 minutes or more.

Through the seed heating process as described above, it is possible to reduce the dislocation density at the crystal growing surface of the sapphire seed to $10^3/cm^2$ or lower.

Further, in addition to forming the entire sapphire seed in a hexagonal prism or triangle prism, the shape of the sapphire seed used in the present invention may be a hexagonal prism whose top end has a shape of hexagonal cone, or a triangle prism whose top end has a shape of triangle cone. In particular, in the case where the top end thereof is formed in a cone shape, it is possible to effectively prevent the introduction of dislocation caused by the thermal shock at the time when the seed is brought into contact with the melt.

The descriptions above only show an example of the embodiment of the present invention, and the present invention is not limited to the embodiment above.

EXAMPLES

First Experiment Example

Example 1

From a sapphire single crystal, a hexagonal-prism sapphire seed whose side face is a {1-100} face is prepared (diameter of circumscribing circle: 10 mm, length: 120 mm). The surface of the prepared seed is subjected to a finishing process including polishing and etching. The thermal treatment is applied to the sapphire seed in the air at 1500° C. for 20 minutes to obtain a sapphire single crystal seed.

Using the sapphire single crystal seed described above, an ingot is prepared by growing a sapphire single crystal through the CZ method with the (0001) face being a crystal growing surface.

Example 2

A sapphire single crystal seed is prepared by the same method as Example 1 except that the thermal treatment is applied for 30 minutes in Example 2, and a sapphire single crystal is grown.

Example 3

A sapphire single crystal seed is prepared by the same method as Example 1 except that the thermal treatment is applied for 60 minutes in Example 3, and a sapphire single crystal is grown.

Example 4

A sapphire single crystal seed is prepared by the same method as Example 1 except that the thermal treatment is applied for 120 minutes in Example 4, and a sapphire single crystal is grown.

Example 5

A sapphire single crystal seed is prepared by the same method as Example 1 except that in Example 5, the thermal treatment includes a high temperature thermal treatment at 1500° C. for 30 minutes and a low temperature thermal treatment applied at 1200° C. for 10 minutes after the high temperature thermal treatment, and a sapphire single crystal is grown.

Example 6

A sapphire single crystal seed is prepared by the same method as Example 1 except that Example 6 repeats, two times, the thermal treatment including a high temperature thermal treatment at 1500° C. for 30 minutes and a low temperature thermal treatment applied at 1200° C. for 10 minutes after the high temperature thermal treatment, and a sapphire single crystal is grown.

Comparative Example 1

From a sapphire single crystal, a sapphire single crystal seed is prepared by the same method as Example 1 except that, in Comparative Example 1, a square-prism sapphire seed whose side face is optionally set is prepared with a (0001) face being a crystal growing surface (cross-sectional area: 10 mm×10 mm, length: 120 mm), and a sapphire single crystal is grown.

Comparative Example 2

From a sapphire single crystal, a sapphire single crystal seed is prepared by the same method as Example 1 except that, in Comparative Example 2, a crystal growing surface is a (0001) face, and a side face of the seed is positionally displaced by 15° around the c axis with respect to a {1-100} face, and a sapphire single crystal is grown.

Comparative Example 3

From a sapphire single crystal, a sapphire single crystal seed is prepared by the same method as Example 6 except that, in Comparative Example 3, a square-prism sapphire seed whose side face is optionally set is prepared with a (0001) face being a crystal growing surface (cross-sectional area: 10 mm×10 mm, length: 120 mm), and a sapphire single crystal is grown.

Comparative Example 4

From a sapphire single crystal, a sapphire single crystal seed is prepared by the same method as Example 6 except that, in Comparative Example 4, a crystal growing surface is a (0001) face, and a side face of the seed is a positionally displaced by 15° around the c axis with respect to a {1-100} face, and a sapphire single crystal is grown.

[Evaluation]

For the sapphire single crystals grown in Examples 1 to 6 and Comparative Examples 1 to 4 described above, dislocation densities are measured such that: the sapphire single crystals are sliced in a direction perpendicular to the growing direction with a thickness of about 1 mm; the surfaces of the sliced crystals are polished; and, dislocation is observed in the vicinity of the surface of the substrates using an asymmetrically reflected X-rays topograph method. More specifically, since dislocation can be seen in a line-like shape in the X-rays topograph image, the length of the dislocation lines can be measured. The dislocation density is defined as a length of the dislocation line per unit volume (cm/cm$^3$=cm$^{-2}$). Table 1 shows the measurement results.

TABLE 1

| | Dislocation density of manufactured sapphire single crystal (cm$^{-2}$) |
|---|---|
| Example 1 | $7 \times 10^3$ |
| Example 2 | $5 \times 10^3$ |
| Example 3 | $\leq 1 \times 10^3$ |
| Example 4 | $\leq 1 \times 10^3$ |
| Example 5 | $\leq 1 \times 10^3$ |
| Example 6 | $\leq 1 \times 10^3$ |
| Comparative Example 1 | $1 \times 10^4$ |
| Comparative Example 2 | $1 \times 10^4$ |
| Comparative Example 3 | $1 \times 10^4$ |
| Comparative Example 4 | $1 \times 10^4$ |

From Table 1, it can be known that Examples 1 to 6, which are obtained by growing the single crystal sapphires using the sapphire single crystal seeds obtained through the manufacturing method according to the present invention, exhibit reduced dislocation density in the single crystal sapphire and provide high quality sapphire single crystals, as compared with Comparative Examples 1 to 4.

Second Experiment Example

Example 1

From a sapphire single crystal, a hexagonal-prism sapphire seed whose side face is a {1-100} face is prepared (diameter of circumscribing circle: 10 mm, length: 120 mm). The surface of the seed is subjected to a finishing process including polishing and etching.

Alumina (10 kg) is put into a crucible formed of Mo and having a diameter of 200 mm. Then, the temperature thereof is raised to the melting point (2050° C.) or more to prepare a raw material melt.

The first thermal treatment is performed such that the sapphire seed is held at a position of 350 mm above the raw material melt (temperature: 1800° C.) for an hour. Then, the sapphire seed is lowered quietly to the position immediately above the melt (temperature: 2050° C.), and is maintained at the position for 30 minutes, for the purpose of approaching the temperature of the seed to the temperature of the melt. After this, a (0001) face of the sapphire seed is brought into contact with the raw material melt, and a shoulder thereof is widened to grow the sapphire single crystal so as to have a diameter of 100 mm and a length of 200 mm, thereby preparing an ingot.

Example 2

The sapphire seed similar to Example 1 is held at a position at which the temperature of the top end thereof is 1200° C. or lower, until the alumina raw material melts. After the raw material melts, the first thermal treatment is performed such that the sapphire seed is held at a position of 350 mm above the raw material melt (temperature; 1800° C.) for 30 minutes. Then, the second thermal treatment is performed such that the sapphire seed is lifted, and is held at a position of 600 mm (temperature: 1200° C.) for 10 minutes. The first thermal treatment is performed again such that it is held at a position of 350 mm above the melt (temperature: 1800° C.) for 30 minutes. Then, the sapphire seed is lowered quietly to the position immediately above the melt (temperature: 2050° C.), and is maintained at the position for 30 minutes, for the purpose of approaching the temperature of the seed to the temperature of the melt. Except for the points described above, the sapphire single crystal is grown by the same method as Example 1.

Comparative Example 1

From a sapphire single crystal, a sapphire seed is prepared by the same method as Example 1 except that, in Comparative Example 1, a square-prism sapphire seed whose side face is optionally set is prepared with a (0001) face being a crystal growing surface (cross-sectional area: 10 mm×10 mm, length: 120 mm), and a sapphire single crystal is grown.

Comparative Example 2

From a sapphire single crystal, a sapphire seed is prepared by the same method as Example 1 except that, in Comparative Example 2, a crystal growing surface is a (0001) face, and a side face of the seed is positionally displaced by 15° around the c axis with respect to a {1-100} face, and a sapphire single crystal is grown.

Comparative Example 3

From a sapphire single crystal, a sapphire seed is prepared by the same method as Example 2 except that, in Comparative Example 3, a square-prism sapphire seed whose side face is optionally set is prepared with a (0001) face being a crystal growing surface (cross-sectional area: 10 mm×10 mm, length: 120 mm), and a sapphire single crystal is grown.

Comparative Example 4

From a sapphire single crystal, a sapphire seed is prepared by the same method as Example 2 except that, in Comparative Example 4, a crystal growing surface is a (0001) face, and a side face of the seed is positionally displaced by 15° around the c axis with respect to a {1-100} face, and a sapphire single crystal is grown.

[Evaluation]

For the sapphire single crystals grown in Examples 1 to 2 and Comparative Examples 1 to 4 described above, dislocation densities are measured such that: the sapphire single crystals are sliced in a direction perpendicular to the growing direction with a thickness of about 1 mm; the surfaces of the sliced crystals are polished; and, dislocation is observed in the vicinity of the surface of the substrate using an asymmetrically reflected X-rays topograph method. Table 2 shows the measurement results.

TABLE 2

| | Dislocation density of manufactured sapphire single crystal (cm$^{-2}$) |
|---|---|
| Example 1 | $5 \times 10^3$ |
| Example 2 | $\leq 1 \times 10^3$ |
| Comparative Example 1 | $1 \times 10^4$ |
| Comparative Example 2 | $1 \times 10^4$ |
| Comparative Example 3 | $1 \times 10^4$ |
| Comparative Example 4 | $1 \times 10^4$ |

From Table 2, it can be known that Examples 1 to 2, which are obtained by growing the single crystal sapphires according to the present invention, exhibit reduced dislocation density in the single crystal sapphire and provide high quality sapphire single crystals, as compared with Comparative Examples 1 to 4.

As described above, a sapphire wafer is obtained by cutting the sapphire single crystal obtained by the manufacturing method according to the present invention in a perpendicular direction to the c axis direction, and its surface has a dislocation density of $7 \times 10^3$ or lower, more preferably $5 \times 10^3$ or lower, most preferably $1 \times 10^3$ or lower.

Industrial Applicability

According to the present invention, a predetermined thermal treatment is applied to a sapphire seed used for growing a crystal with a (0001) face thereof being a crystal growing surface and having a side face forming a crystal face positioned within a {1-100} face±predetermined range and a shape formed so as to include a hexagonal prism or triangle prism. Therefore, it is possible to obtain a sapphire seed having a predetermined value or lower of a dislocation density at the crystal growing surface. Further, by using said sapphire seed, it is possible to grow, on the (0001) face, a high quality sapphire single crystal having reduced dislocation density or free from dislocation.

| EXPLANATION OF REFERENCE NUMERALS | |
|---|---|
| 1 | Crucible |
| 2 | Raw material melt |
| 3 | Sapphire seed |
| 4 | Sapphire single crystal |

The invention claimed is:

1. A method of manufacturing a sapphire seed formed by a sapphire single crystal and used for growing another sapphire single crystal on a (0001) face as a crystal growing surface, the method comprising:
preparing a sapphire seed whose side face forms a crystal face within a {1-100} face±10°, and whose shape is processed so as to include a hexagonal prism or a triangle prism; and
applying a predetermined thermal treatment to said sapphire seed,
wherein the thermal treatment includes a two-step thermal treatment formed by a first thermal treatment in the range of 1400 to 1800° C. and a second thermal treatment in the range of 1000 to 1200° C.

2. The method of manufacturing a sapphire seed according to claim 1, wherein, in the thermal treatment, the two-step thermal treatment is repeated plural times.

3. The method of manufacturing a sapphire seed according to claim 1, wherein, in the thermal treatment, the first thermal treatment is applied for 30 minutes or more.

4. The method of manufacturing a sapphire seed according to claim 1, wherein, in the thermal treatment, the second thermal treatment is applied for 10 minutes or more.

5. A method of manufacturing a sapphire single crystal, comprising:
a step of applying a predetermined thermal treatment to a sapphire seed formed by a sapphire single crystal and having a side face that forms a crystal face within a {1-100} face±10°, the sapphire seed being shaped so as to include a hexagonal prism or a triangle prism;
a step of introducing a raw material for growing a sapphire single crystal into a crucible, heating the introduced raw material to melt, thereby forming a raw material melt;
a step of bringing the sapphire seed that has been applied to the thermal treatment into contact with the raw material melt; and
a step of growing a sapphire single crystal on a (0001) face of the sapphire seed while pulling up the sapphire seed, wherein the thermal treatment is applied in a manner that the sapphire seed is disposed above the raw material melt, and the thermal treatment includes a two-step thermal treatment formed by a first thermal treatment applied at a first position above the raw material melt in a manner that a temperature of a top end of the sapphire seed is in the range of 1400 to 1800° C. and a second thermal treatment applied at a second position above the raw material melt in a manner that a temperature of the top end of the sapphire seed is in the range of 1000 to 1200° C.

6. The method of manufacturing a sapphire single crystal according to claim 5, wherein, in the thermal treatment, the two-step thermal treatment is repeated plural times.

7. The method of manufacturing a sapphire single crystal according to claim 5, wherein, in the thermal treatment, the first thermal treatment is applied for 30 minutes or more.

8. The method of manufacturing a sapphire single crystal according to claim 5, wherein, in the thermal treatment, the second thermal treatment is applied for 10 minutes or more.

* * * * *